United States Patent
Müssig

(10) Patent No.: US 7,528,434 B2
(45) Date of Patent: May 5, 2009

(54) PRODUCTION PROCESS FOR A SEMICONDUCTOR COMPONENT WITH A PRASEODYMIUM OXIDE DIELECTRIC

(75) Inventor: Hans-Joachim Müssig, Dresden (DE)

(73) Assignee: IHP GmbH - Innovations For High Performance, Frankfurt (DE)

( * ) Notice: Subject to any disclaimer, the term of this patent is extended or adjusted under 35 U.S.C. 154(b) by 0 days.

(21) Appl. No.: 10/569,074

(22) PCT Filed: Aug. 20, 2004

(86) PCT No.: PCT/EP2004/009559

§ 371 (c)(1),
(2), (4) Date: Oct. 13, 2006

(87) PCT Pub. No.: WO2005/024930

PCT Pub. Date: Mar. 17, 2005

(65) Prior Publication Data

US 2007/0138519 A1    Jun. 21, 2007

(30) Foreign Application Priority Data

Aug. 28, 2003 (DE) ................. 103 40 202

(51) Int. Cl.
H01L 27/108 (2006.01)
(52) U.S. Cl. ............... 257/310; 257/410; 257/E21.192; 257/E21.625; 438/240; 438/287; 438/591; 438/786
(58) Field of Classification Search ......... 257/310, 257/406, 410, 411, E21.192, E21.625; 438/240, 438/287, 785, 786, 591
See application file for complete search history.

(56) References Cited

U.S. PATENT DOCUMENTS

| 6,656,852 B2 | 12/2003 | Rotondaro et al. |
| 2001/0031562 A1 | 10/2001 | Raaijmakers et al. |
| 2002/0158245 A1 | 10/2002 | Yu et al. |
| 2003/0062558 A1 | 4/2003 | Yang et al. |
| 2003/0111678 A1 | 6/2003 | Colombo et al. |
| 2003/0119291 A1 | 6/2003 | Ahn et al. |
| 2003/0193061 A1 | 10/2003 | Osten |

(Continued)

FOREIGN PATENT DOCUMENTS

DE    10039327 A1    2/2002

(Continued)

OTHER PUBLICATIONS

English translation of DE 10156932 A1 abstract.

(Continued)

*Primary Examiner*—George Fourson
*Assistant Examiner*—Julio J. Maldonado
(74) *Attorney, Agent, or Firm*—Ware, Fressola, Van Der Sluys & Adolphson LLP

(57) ABSTRACT

The invention concerns a semiconductor component and an associated production process having a silicon-bearing layer, a praseodymium oxide layer and a mixed oxide layer arranged between the silicon-bearing layer and the praseodymium oxide layer and containing silicon, praseodymium and oxygen. It is possible because of the mixed oxide layer on the one hand to improve the capacitance of the component and on the other hand to achieve a high level of charge carrier mobility without the necessity for a silicon oxide intermediate layer.

10 Claims, 2 Drawing Sheets

U.S. PATENT DOCUMENTS

2003/0228747 A1   12/2003  Ahn et al.
2005/0037574 A1*  2/2005   Sugiyama ................... 438/257
2005/0212030 A1   9/2005   Müssig

FOREIGN PATENT DOCUMENTS

DE   10156932 A1   5/2003
EP   1 043 426     3/2000
EP   1 096 042     10/2000

OTHER PUBLICATIONS

Burn Ki Moon et al., Roles of Buffer Layers in Epitaxial Growth of SrTiO$_3$, Films on Silicon Substates, XP-000885177, Jpn. J. Appl. Phys. vol. 33 (1994) pp. 1472-1477, Part 1, No. 3A, Mar. 1994.

A. Goryachko et al., Thermal stability of Pr$_2$O$_3$ films grown on Si(100) substrate, J. Vac. Sci. Technol. A 20(6), Nov./Dec. 2002, 2002 American Vacuum Society, pp. 1860-1866.

H. J. Osten, et al., High-k Gate Dielectrics with Ultra-Low Leakage Current Based on Praseodymium Oxide, IEDM 00-653, 0-7803-6438-4/00 2000 IEEE, pp. 653-656.

Z.M. Wang et al., Photoemission study of the interaction of a Pr$_2$O$_3$ Overlayer with Si(100) as a function of annealing temperature, Microelectric Engineering 66 (2003) 608-614, 2002 Elsevier Science B.V., (www.elsevier.com/locate/mee.

Haruhiko Ono et al., Interfacial reactions between thin rare-earth-metal oxide films and Si substrates, Applied Physics Letter, vol. 78, No. 13, Mar. 26, 2001.

Sanghum Jeon et al., Excellent Electrical Characteristics of Lanthanide (Pr, Nd, Sm, Gd, and Dy) Oxide . . . , Department of Materials Science and Engineering, Kwangiu Institute of Science and Technology, Korea, IEEE 2001, IEDM 01-471.

U.S. Appl. No. 10/528,868, filed Mar. 24, 2005, Hans-Joachim Müssig.

* cited by examiner

PRODUCTION PROCESS FOR A SEMICONDUCTOR COMPONENT WITH A PRASEODYMIUM OXIDE DIELECTRIC

CROSS REFERENCE TO RELATED APPLICATIONS

This application is for entry into the U.S. national phase under §371 for International Application No. PCT/EP2004/009559 having an international filing date of 24 Aug. 2004, and from which priority is claimed under all applicable sections of Title 35 of the United States Code including, but not limited to, Sections 120, 363 and 365(c), and which in turn claims priority under 35 USC §119 to German Patent Application No. 103 40 202.0 filed 28 Aug. 2003.

BACKGROUND OF THE INVENTION

1. Technical Field

The invention concerns a production process for a semiconductor component having a silicon-bearing layer, a praseodymium oxide layer and a mixed oxide layer which is arranged between the silicon-bearing layer and the praseodymium oxide layer and which contains silicon, praseodymium and oxygen. The invention further concerns semiconductor components produced by way of the process and electronic devices with semiconductor components of that kind.

2. Discussion of Related Art $Pr_2O_3$ layers on Si(001) substrates, because of their comparatively high dielectric constants ($k \approx 30$), are particularly suitable for replacing the traditional gate-dielectric material $SiO_2$ in sub-0.1 μm CMOS technology. It is however generally assumed that an ultra-thin $SiO_2$ layer is necessary between the Si substrate and an alternative dielectric material in order to match bondings and charges to each other and to reduce mechanical stresses and in that way to achieve a high level of charge carrier mobility.

As the following consideration shows, such a thin $SiO_2$ intermediate layer reduces the dielectric effectiveness of the substitute material. If we assume that the thickness $t_{high-k}$ of the alternative dielectric is to afford the same capacitance as an $SiO_2$ layer of the equivalent thickness $t_{eq}$, that gives:

$$t_{high-k} = (k_{high-k}/k_{SiO2})t_{eq}, \quad (1)$$

wherein $k_{SiO2}$ is the dielectric constant of the $SiO_2$. As the $SiO_2$ intermediate layer represents a second capacitance $C_{SiO2}$ connected in series with the alternative dielectric, the resulting capacitance can be calculated as follow:

$$1/C_{res} = 1/C_{high-k} + 1/C_{SiO2}, \quad (2)$$

wherein $C_{high-k}$ is the capacitance of the dielectric layer. Using (1), that then gives the following for the equivalent thickness of the layer system $t^s_{eq}$, comprising a thin $SiO_2$ layer $t_{SiO2}$ and the dielectric layer $t_{high-k}$, $$t^s_{eq} = t_{SiO2} + (k_{SiO2}/k_{high-k})t_{high-k}, \quad (3)$$

It follows directly from (3) that the minimum attainable equivalent oxide thickness $t^s_{eq}$ can never be less than the thickness $t_{SiO2}$ of the $SiO_2$ layer. Consequently, in the series connection of two capacitances with very different dielectric constants the material with the lower dielectric constant—in general the $SiO_2$—will limit the maximum possible capacitance of the layer stack.

While a very high capacitance in respect of the layer, in the case of extremely slight leakage currents, is essential for use of the material in dynamic RAMs (DRAMs), a very high interface quality and charge carrier mobility in the channel are crucial for use of the material in MOSFETs.

There is therefore a need for alternative materials for forming an intermediate layer between the silicon-bearing layer and the praseodymium oxide layer, wherein that intermediate layer both should have a greater dielectric constant than $SiO_2$ and also should have adequate chemical and thermal stability in relation to the working processes which are currently employed in semiconductor technology.

One approach for establishing semiconductor components with a sufficiently high capacitance and charge carrier mobility even when particularly small dimensions are involved provides a mixed oxide layer which is arranged between the silicon-bearing layer and the praseodymium oxide layer and which contains silicon, praseodymium and oxygen. That mixed oxide layer is necessary to achieve adaptation of crystal structure and charge. A suitable mixed oxide layer is chemically and thermally stable, it involves a low defect density and it does not contain any silicide phases.

It will be noted however that it has been found that, in the direct growth of the mixed oxide layers on the silicon-bearing semiconductor layer, depending on the process conditions involved, active or passive oxidation of the silicon surface takes place. In particular active oxidation which dominates at temperatures above 600° C. and with low oxygen partial pressures results in roughening of the silicon surface as a consequence of $SiO_x$ desorption and thus results in a poorer quality both in respect of the interface between the mixed oxide layer and the silicon-bearing layer and also in respect of the mixed oxide layer.

DISCLOSURE OF INVENTION

The technical object of the present invention is to provide a production process, as an alternative thereto, for a semiconductor component with a sufficiently high capacitance and charge carrier mobility, even with particularly small dimensions.

A further object of the invention is to provide a semiconductor component with a sufficiently high capacitance and charge carrier mobility, even with particularly small dimensions.

Those objects are achieved by a production process according to the invention and a semiconductor component produced by the process according to the invention.

The production process according to the invention for a semiconductor component on a silicon-bearing substrate or on a substrate with a silicon-bearing layer, a praseodymium oxide layer and a mixed oxide layer which is arranged between the silicon-bearing layer and the praseodymium oxide layer and which contains silicon, praseodymium and oxygen, includes for that purpose the steps:

producing or depositing a thin silicon dioxide ($SiO_2$) layer or silicon oxynitride ($SiO_xN_y$) layer on the silicon-bearing layer or the silicon-bearing substrate, depositing praseodymium on the $SiO_2$ layer or the silicon oxynitride layer, wherein during or after the deposit of praseodymium a solid phase reaction between the praseodymium and the ($SiO_2$) layer or silicon oxynitride ($SiO_xN_y$) layer is produced with the formation of the mixed oxide layer, optionally depositing titanium on the mixed oxide layer and causing a reaction of titanium with oxygen possibly contained in excess in the mixed oxide layer to afford titanium oxide, and depositing a praseodymium oxide layer on the mixed oxide layer or, where present, on the titanium oxide.

The advantage of the solid phase reaction which is involved with or follows the deposit of praseodymium over other processes for the production of praseodymium silicate or mixed oxide layers on clean silicon wafers is that it is possible to start from a thin, electrically perfect $SiO_2$ or $SiO_xN_y$ layer which is produced with a tried-and-tested and established oxidation process on the silicon-bearing layer and that the good interface quality in relation to the silicon-bearing layer or the silicon-bearing substrate is maintained due to the subsequent silicate or mixed oxide formation. The silicon-bearing substrate is a semiconductor substrate.

Silicate formation takes place because praseodymium is more electropositive than silicon. The formation of Si—O—Pr complexes, in comparison with the Si—O—Si complex, reduces the ionicity in the Si—O bond. That reduction of $SiO_2$ by charge transfer from the praseodymium to the $SiO_2$ already takes place at ambient temperature (20° C.). That means that juxtaposition of $SiO_2$ and $Pr_2O_3$ is disadvantageous from the thermodynamic point of view. To optimise the solid phase reaction it is also possible to adopt elevated temperatures, under ultra-high vacuum conditions (UHV) at most however up to 700° C.

In accordance with a preferred configuration of the process after termination of the solid phase reaction an oxygen treatment of the mixed oxide layer is carried out in order to compensate for a possible oxygen deficient. The oxygen treatment is preferably effected in the temperature range of between about 20° C. and 600° C. and is preferably continued until a possible deficient of oxygen atoms in the mixed oxide layer is compensated. In that respect the mixed oxide phase is to correspond in particular to the composition $(Pr_2O_3)_x(SiO_2)_{1-x}$, wherein $x \geq 0.3$ and $x < 1$.

It is further preferred that the deposit of the praseodymium oxide layer or possibly the oxygen treatment is followed by a heat treatment in a nitrogen atmosphere in the temperature range of between about 500° C. and 700° C., in particular at about 600° C. The mixed oxide layer is stabilised in relation to atmospheric influences by the heat treatment.

In a further embodiment deposit of titanium on the mixed oxide layer is optionally effected and a reaction of titanium with the oxygen contained in particular in excess in the mixed oxide layer to afford titanium oxide is caused. In that way it is possible to bind an oxygen excess which is possibly present, in the mixed oxide layer. It has been found that titanium, on the one hand, by virtue of its reactivity, binds oxygen to form titanium oxide and on the other hand a titanium oxide layer which is formed in that case does not have any substantial negative effects on the dielectric properties. As is known titanium oxide is itself electrically insulating.

In this process the step of depositing titanium is effected either during or after or both during and also after the deposit of praseodymium on the thin $SiO_2$ layer or the silicon oxynitride $(SiO_xN_y)$ layer. A titanium content additionally stabilises the praseodymium oxide layer in relation to atmospheric influences.

A preferred process implementation is one in which the deposit of praseodymium takes place at substrate temperatures in the range of between about 10° C. and 30° C., in particular at ambient temperature (20° C.). The temperatures already generally suffice for carrying out the solid phase reaction. In that way a reaction which is thermally very gentle in comparison with other processes is possible.

The choice of the temperature regime in the step of depositing praseodymium (for example substrate temperature), the oxygen or titanium treatment and the heat treatment influences the morphology and stoichiometry of the mixed oxide phase. The selected process conditions are intended to promote the formation of a mixed oxide comprising silicon, praseodymium and oxygen (silicate phase) having the desired properties.

Preferably the step of depositing the praseodymium takes place out of the gas phase. In that way it is possible to achieve a particularly controlled solid phase reaction with the temporarily present $SiO_2$ or $SiO_xN_y$ layer.

The depositing step can be effected by means of physical deposition processes, in particular by means of molecular beam epitaxy (MBE), thermal evaporation or cathode sputtering. Alternatively Pr deposit can also be effected by chemical gas phase deposition (CVD) with a praseodymium-bearing reaction gas.

The deposit of $Pr_2O_3$ is then effected directly on the silicate or mixed oxide layer, either by evaporation or sputtering under UHV conditions or by means of CVD.

The semiconductor component according to the invention includes a silicon-bearing substrate or a silicon-bearing layer, a praseodymium oxide layer and a silicon-bearing, praseodymium-bearing and oxygen-bearing mixed oxide layer which is arranged between the silicon-bearing layer or the silicon-bearing substrate and the praseodymium oxide layer and which is produced by the process according to the invention. The mixed oxide layer has a good surface quality which is caused by the production process thereof. The invention is therefore also based on the realisation that a silicon-bearing, praseodymium-bearing and oxygen-bearing mixed oxide is suitable for combining the advantageous properties of the hitherto usual $SiO_2/Si(001)$ interface with those of the alternative dielectric praseodymium (for example in the form $Pr_2O_3$).

The mixed oxide which hereinafter is also referred to praseodymium silicate has a greater dielectric constant in comparison with silicon oxide. On the assumption that the mixed oxide layer is of the same thickness as an otherwise necessary silicon oxide intermediate layer between the silicon-bearing substrate and the praseodymium oxide, the minimum attainable equivalent oxide thickness is reduced, in accordance with equation (3), by a factor which corresponds to the ratio of the dielectric constants of praseodymium silicate and silicon oxide, that is to say approximately by a factor of 3 to 4.

The mixed oxide layer affords a high level of charge carrier mobility in the semiconductor component according to the invention in accordance with the present state of knowledge by virtue of the fact that there are Si—O bonds and no Si—Pr bonds at the interface relative to the silicon-bearing layer. For, the Si—O bonds afford electrical properties as are known from the $SiO_2/Si(001)$ interface.

Accordingly by means of the mixed oxide layer according to the invention it is possible to guarantee on the one hand a very high level of interface quality and on the other hand a sufficiently high capacitance. A transition from the silicon-bearing substrate to the dielectric is achieved, which has all the required properties.

In an embodiment the mixed oxide layer adjoins on the one hand the substrate or the silicon-bearing layer and on the other hand the praseodymium oxide layer.

In an embodiment besides silicon, praseodymium and oxygen, the mixed oxide does not contain any further elements. Minor impurities without functional significance are to be disregarded in that respect.

In a further embodiment a titanium oxide layer is additionally present between the mixed oxide layer and the praseodymium oxide layer. In that respect use is made of the fact that titanium is capable of bonding excess oxygen in the mixed oxide to form titanium oxide without that causing the dielectric properties of the overall layer structure praseodymium silicate/titanium oxide/praseodymium oxide to be substantially worsened in comparison with a praseodymium silicate/praseodymium oxide structure. In that case the titanium oxide layer does not have to cover the entire interface between the metal oxide layer and the praseodymium oxide layer. It is possible for only interface portions to be covered. Instead of being at that interface or in addition to the arrangement at that interface titanium oxide can also be included in small amounts in the mixed oxide layer or in the praseodymium oxide layer, in particular in the proximity of the common interface.

In accordance with the foregoing, the thickness of the mixed oxide layer influences the capacitance of a capacitor structure which includes the silicon-bearing layer and the praseodymium oxide layer in a semiconductor component according to the invention. Preferably the layer thickness is at a maximum 3 nm. The higher the value of the capacitance that is sought to be achieved for a semiconductor component, the correspondingly smaller should be the selected layer thickness of the mixed oxide layer.

In an embodiment of the invention which is particularly preferred at the present time the mixed oxide layer is a pseudo-binary, generally non-stoichiometric alloy (silicate phase). In particular the mixed oxide layer corresponds to the composition $(Pr_2O_3)_x (SiO_2)_{1-x}$ wherein $0.3 \leq x < 1$. The value x is dependent on the layer thickness. In other words, in the case of components involving different thicknesses for the mixed oxide layer, the coefficients x differ. The coefficient x increases with the layer thickness.

In a preferred embodiment the silicon-bearing layer comprises doped or undoped silicon. It is however also possible to provide a doped or undoped silicon-germanium alloy in the silicon-bearing layer. When a silicon-germanium alloy is used, nitrogen can additionally be incorporated into the silicon-bearing layer to achieve a high-quality interface. In that case the silicon-bearing layer at the interface to the mixed oxide layer preferably involves a (001) orientation. A particularly high level of interface quality is achieved in that way.

The component according to the invention can preferably be in the form of an MOSFET (metal oxide semiconductor field effect transistor) or in the form of a memory component in a RAM unit (random access memory) as well as a dynamic ROM (dynamic read only memory, DROM).

BRIEF DESCRIPTION OF THE DRAWINGS

The invention is described in greater detail hereinafter with reference to two Figures of drawings in which.

DETAILED DESCRIPTION

Figure 1:
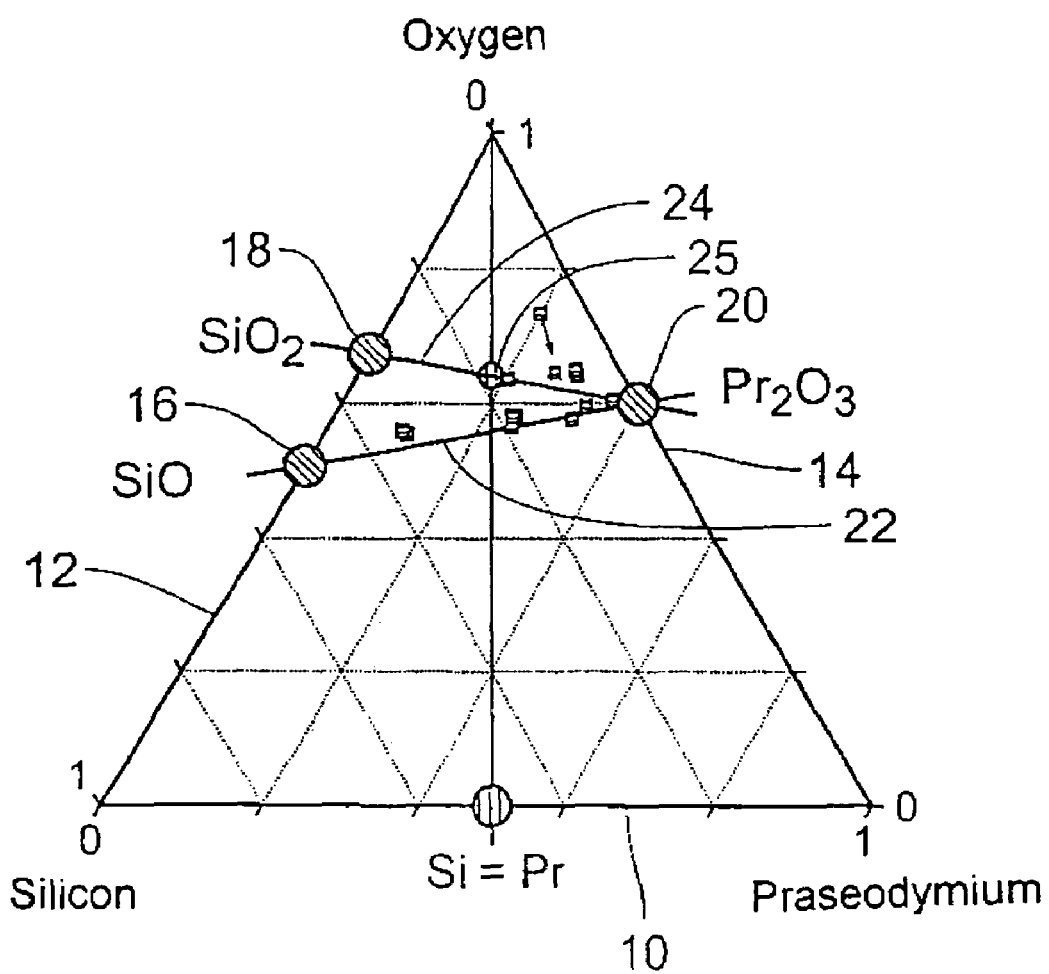
FIG. 1 shows a ternary phase diagram for the praseodymium-oxygen-silicon system.

FIG. 1 shows a ternary phase diagram for the praseodymium-oxygen-silicon system. That phase diagram was experimentally ascertained in the context of research work in connection with the present invention.

The phase diagram has three co-ordinate axes 10, 12 and 14 arranged in the form of an equilateral triangle. The elements praseodymium, oxygen and silicon are associated with the corner points of the equilateral triangle. The concentration of those elements corresponds there to the value 1. The concentration of the respective element falls along the sides of the triangle, to the value zero.

Silicon monoxide SiO is present with a silicon content 0.5. That point of the phase diagram is identified by reference numeral 16. Silicon dioxide $SiO_2$ is present with a silicon content of 0.33. That point of the phase diagram is identified by reference numeral 18. Along the co-ordinate axis 14 the phase contains exclusively praseodymium and oxygen and no silicon. The Figure also shows the point 20 at which praseodymium oxide is present in the form $Pr_2O_3$.

Various experimentally ascertained phases of the mixed oxide are illustrated within the triangle formed by the three co-ordinate axes 10, 12 and 14, in the form of squares. The experimental values were ascertained by means of photoelectron spectroscopy on the basis of samples grown in the temperature range of between 600 and 650° C. To ascertain their composition the samples were excited with synchrotron radiation and the energy of the electrons emanating from the sample was recorded and analyzed. It is found that the samples ascertained, depending on the respective oxygen content involved, are on a quasi-binary section line 22 representing a mixed phase of praseodymium oxide $Pr_2O_3$ and silicon monoxide SiO, or on a quasi-binary straight section line 24 representing a mixed phase of praseodymium oxide $Pr_2O_3$ and silicon dioxide $SiO_2$. At a point 25 at which the section line 24 intersects the median perpendicular, leading from the apex to the base, of the triangular phase diagram a $(Pr_2O_3)_x(SiO_2)_{1-x}$ thortveitite structure was ascertained. At that point 25 of the phase diagram the proportions of silicon and praseodymium in the mixed oxide are equal.

The phase diagram in FIG. 1 accordingly shows that it has been possible to produce a praseodymium silicate or a pseudo-binary, non-stoichiometric alloy $(Pr_2O_3)_x(SiO_2)_{1-x}$ with an adjustable proportion x of the praseodymium oxide $Pr_2O_3$.

Figure 2:
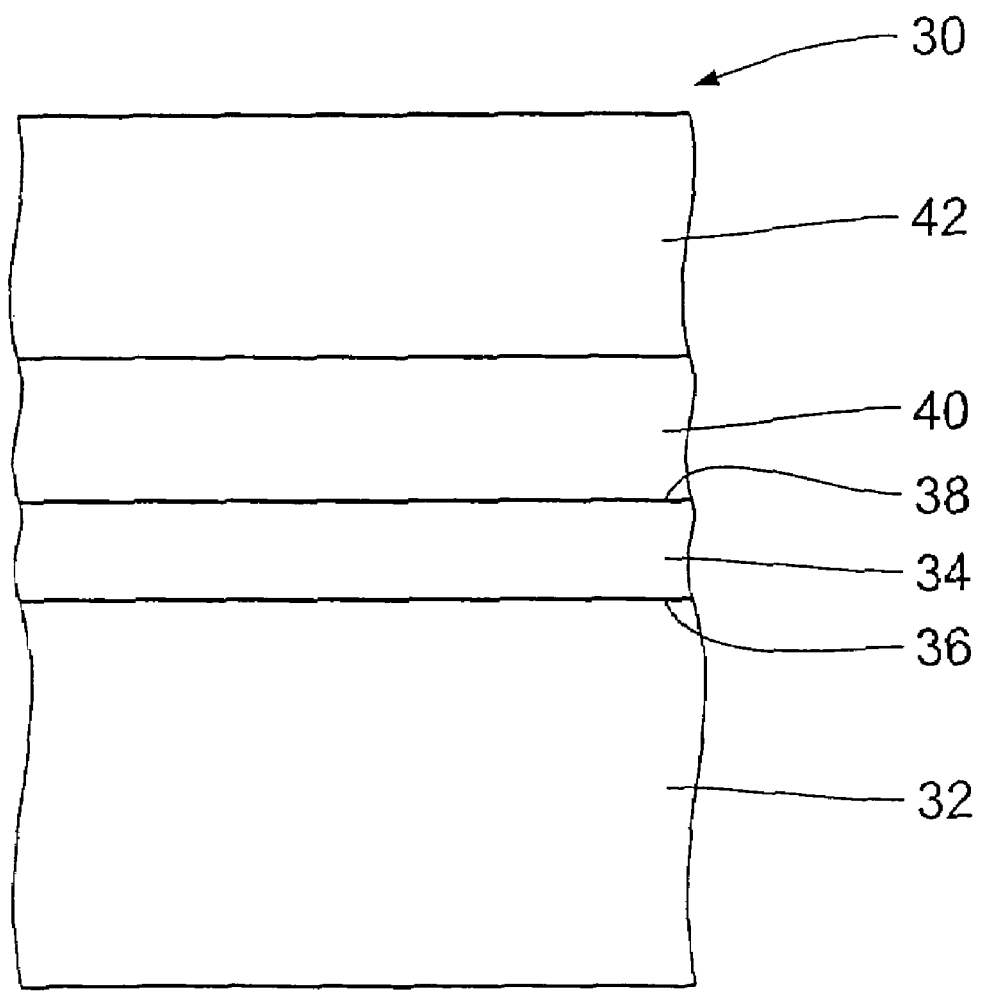
FIG. 2 shows an embodiment of a semiconductor component according to the invention.

FIG. 2 shows a section of an embodiment of a semiconductor component 30 according to the invention with a silicon substrate 32 and a mixed oxide layer 34 adjoining same. At an interface 36 between the silicon substrate 32 and the mixed oxide layer 34 the substrate has a (001) surface. The mixed oxide layer is a $(Pr_2O_3)_x(SiO_2)_{1-x}$ layer wherein the coefficient x at the interface 36 is of a value 0.3 and at an interface 38 to an adjacent praseodymium oxide layer $(Pr_2O_3)$ 40 it is of a value 1. A polysilicon layer 42 is arranged above the praseodymium oxide layer 40 in the present embodiment.

The substrate 32 is not shown in greater detail here in its internal structure. The component 30 which is here also shown only in respect of a section thereof can be for example an MOSFET or a memory element of a DROM memory.

The invention claimed is:

1. A semiconductor component (30) having a silicon-bearing substrate or a substrate having a semiconducting silicon-bearing layer (32), a praseodymium oxide layer (40) and a mixed oxide layer (34) which is arranged between the silicon-bearing surface layer (32) or the silicon-bearing substrate and the praseodymium oxide layer (40) and which contains silicon, praseodymium and oxygen, wherein
    a) either there is additionally a titanium oxide layer between the metal oxide layer and the praseodymium oxide layer, which titanium oxide layer extends either over interface portions or over the entire interface between the mixed oxide layer and the praseodymium oxide layer,
    b) or titanium oxide is included in the mixed oxide layer or in the praseodymium oxide layer in the proximity of the common interface,
    c) or both a) and also b) are fulfilled.

2. A semiconductor component as set forth in claim 1 wherein a layer thickness of the mixed oxide layer (34) is less than 5 nanometers.

3. A semiconductor component as set forth in claim 2 wherein a layer thickness of the mixed oxide layer (34) is a maximum of 3 nanometers.

4. A semiconductor component as set forth in claim 1 wherein the mixed oxide layer (34) corresponds to the composition $(Pr_2O_3)x(SiO_2)_{1-x}$, wherein $0.3 \leq x < 1$.

5. A semiconductor component as set forth in claim 4 wherein the coefficient x rises starting from the substrate or the silicon-bearing layer (32) towards the praseodymium oxide layer (40).

6. A semiconductor component as set forth in claim 1 wherein the mixed oxide layer (34) is a pseudo-binary, generally non-stoichiometric alloy (silicate phase).

7. A semiconductor component as set forth in claim 1 wherein the silicon-bearing surface layer (32) comprises doped or undoped silicon-germanium.

8. A semiconductor component as set forth in claim 1 wherein the substrate or the silicon-bearing surface layer (32) comprises doped or undoped silicon.

9. A semiconductor component as set forth in claim 1 which is in the form of an MOSFET.

10. A semiconductor component as set forth in claim 1 which is in the form of a memory cell.

* * * * *